(12) United States Patent
Chen et al.

(10) Patent No.: US 6,500,727 B1
(45) Date of Patent: Dec. 31, 2002

(54) SILICON SHALLOW TRENCH ETCHING WITH ROUND TOP CORNER BY PHOTORESIST-FREE PROCESS

(75) Inventors: Cheng-Ku Chen, Hsin-Chu (TW); Fang-Cheng Chen, Hsin-Chu (TW); Hun-Jan Tao, Hsin-Chu (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/957,423

(22) Filed: Sep. 21, 2001

(51) Int. Cl.[7] .............................................. H01L 21/76
(52) U.S. Cl. ...................... 438/424; 438/435; 438/437; 148/DIG. 50
(58) Field of Search ................ 438/424, 425, 438/435, 437; 148/DIG. 50

(56) References Cited

U.S. PATENT DOCUMENTS

| 5,880,004 | A | * | 3/1999 | Ho | 438/421 |
| 6,008,131 | A | * | 12/1999 | Chen | 438/710 |
| 6,218,309 | B1 | * | 4/2001 | Miller et al. | 438/700 |
| 6,225,187 | B1 | * | 5/2001 | Huang et al. | 438/424 |
| 6,372,606 | B1 | * | 4/2002 | Oh | 438/424 |
| 6,444,540 | B2 | * | 9/2002 | Kawada et al. | 438/424 |

* cited by examiner

Primary Examiner—Trung Dang
(74) Attorney, Agent, or Firm—George O. Saile; Stephen B. Ackerman; Stephen G. Stanton

(57) ABSTRACT

A method for forming a trench having upper rounded corners comprising the following steps. A substrate having an oxide layer formed thereover is provided. A hard mask layer is formed over the oxide layer. A patterned patterning layer is formed over the hard mask layer leaving one or more portions of the hard mask layer exposed. The hard mask layer is patterned using the patterned patterning layer as a mask to form a patterned hard mask layer having one or more openings exposing one or more portions of the oxide layer. The patterned patterning layer is removed. The oxide layer is patterned using the patterned hard mask layer as a mask using a first trench etching process to etch through the oxide layer at the one or more exposed portions of the oxide layer and into the substrate to form one or more shallow trenches within the substrate having upper rounded corners at the respective interfaces between substrate and patterned oxide layer. The substrate is further etched at the one or more shallow trenches using a second trench etching process to form one or more completed trenches having the upper rounded corners at the respective interfaces between substrate and patterned oxide layer.

39 Claims, 2 Drawing Sheets

SILICON SHALLOW TRENCH ETCHING WITH ROUND TOP CORNER BY PHOTORESIST-FREE PROCESS

BACKGROUND OF THE INVENTION

Shallow trenches having upper rounded top corners may be fabricated using a photoresist mask, but the drawback is severe loading and proximity effect on trench depth and critical dimension (CD) bias. Silicon etching with a hard mask, i.e. a photoresist free method, can gain good uniformity and little proximity effect but it is hard to maintain round top corners.

U.S. Pat. No. 6,180,533 to Jain et al. describes an isotropic plasma etch with a hard mask to round the top corners of an shallow trench isolation (STI) trench.

U.S. Pat. No. 5,807,789 to Chen et al. describes another isotropic plasma etch with a hard mask to round the top corners of an shallow trench isolation (STI) trench.

U.S. Pat. No. 5,843,846 to Nguyen et al. describes an etch process to produce rounded top corners for sub-micron silicon trench applications.

U.S. Pat. No. 4,857,477 to Kanamori describes a process for etching a trench using a first and second mask layer to form the trench.

U.S. Pat. No. 4,729,815 to Leung describes a three step trench etching process to form a vertical trench with rounded top corners.

SUMMARY OF THE INVENTION

Accordingly, it is an object of an embodiment of the present invention to provide an improved round top corner with $Cl_2/O_2$ or $HBr/O_2$.

Other objects will appear hereinafter.

It has now been discovered that the above and other objects of the present invention may be accomplished in the following manner. Specifically, a substrate having an oxide layer formed thereover is provided. A hard mask layer is formed over the oxide layer. A patterned patterning layer is formed over the hard mask layer leaving one or more portions of the hard mask layer exposed. The hard mask layer is patterned using the patterned patterning layer as a mask to form a patterned hard mask layer having one or more openings exposing one or more portions of the oxide layer. The patterned patterning layer is removed. The oxide layer is patterned using the patterned hard mask layer as a mask using a first trench etching process to etch through the oxide layer at the one or more exposed portions of the oxide layer and into the substrate to form one or more shallow trenches within the substrate having upper rounded corners at the respective interfaces between substrate and patterned oxide layer. The substrate is further etched at the one or more shallow trenches using a second trench etching process to form one or more completed trenches having the upper rounded corners at the respective interfaces between substrate and patterned oxide layer.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, steps, methods, etc. may be formed or accomplished by conventional steps or methods known in the prior art.

Initial Structure

Figure 1:
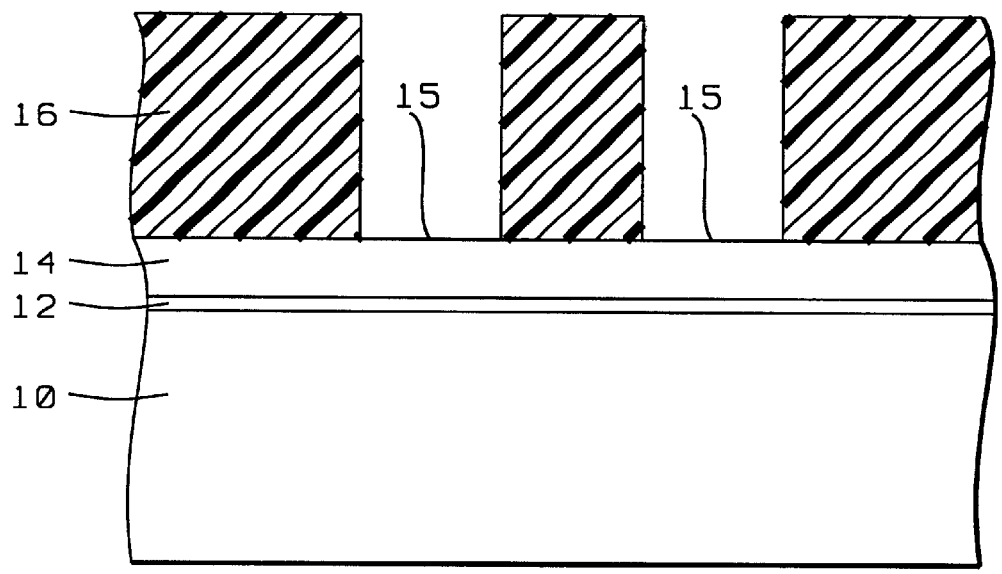
FIGS. 1 to 5 schematically illustrate a preferred embodiment of the present invention.

As shown in FIG. 1, a thin oxide layer 12 is grown over silicon substrate 10 to a thickness of preferably from about 80 to 250 Å and more preferably from about 150 to 200 Å. Oxide layer 12 is preferably comprised of silicon oxide.

Hard mask layer 14 is formed over oxide layer 12 to a thickness of preferably from about 800 to 2000 Å and more preferably from about 1000 to 1500 Å. Hard mask layer 14 is preferably a comprised of silicon nitride ($Si_3N_4$) or silicon oxynitride (SiON) and is more preferably comprised of silicon nitride ($Si_3N_4$).

To pattern hard mask layer 14 a patterned photoresist layer 16 is formed over hard mask layer 14 exposing one or more portions 15 of hard mask layer 14.

Patterning of Hard Mask Layer 14

Figure 2:
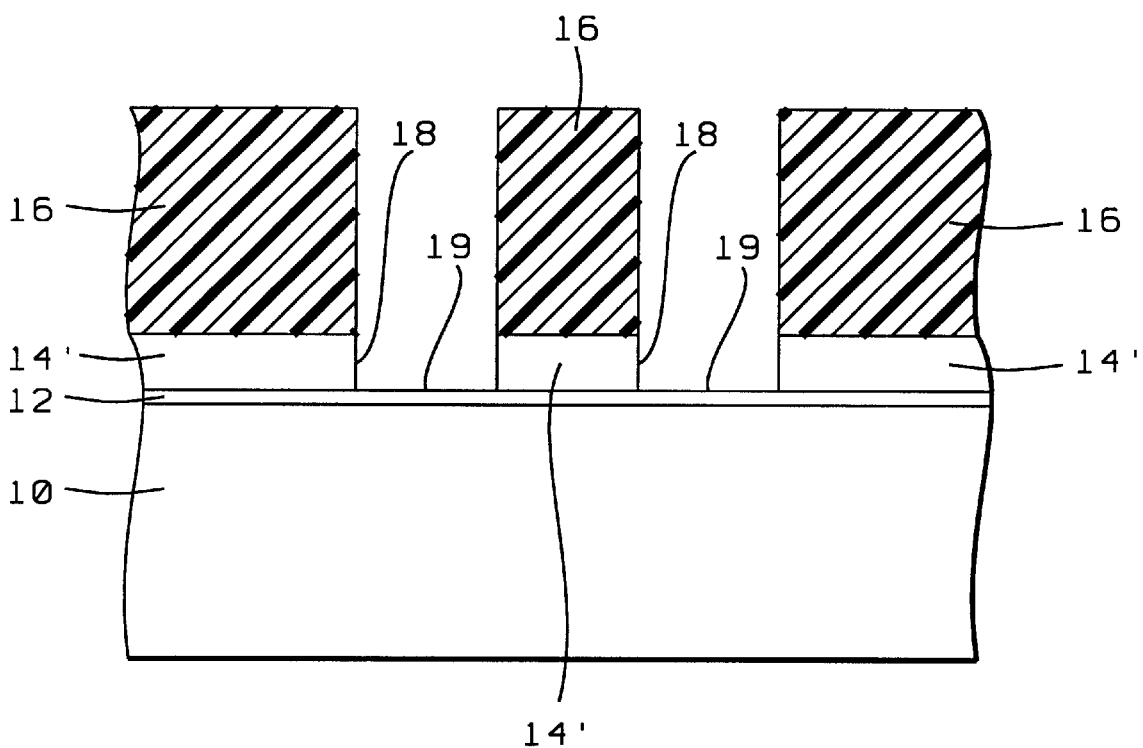

As shown in FIG. 2, hard mask layer 14 is patterned to form openings 18 exposing portions 19 of underlying thin oxide layer 12 by, for example, a reticule by photolithography and etching process using patterned photoresist layer 16 as a mask, and stopping on thin oxide layer 12.

Removal of Patterned Photoresist Layer 16

Figure 3:
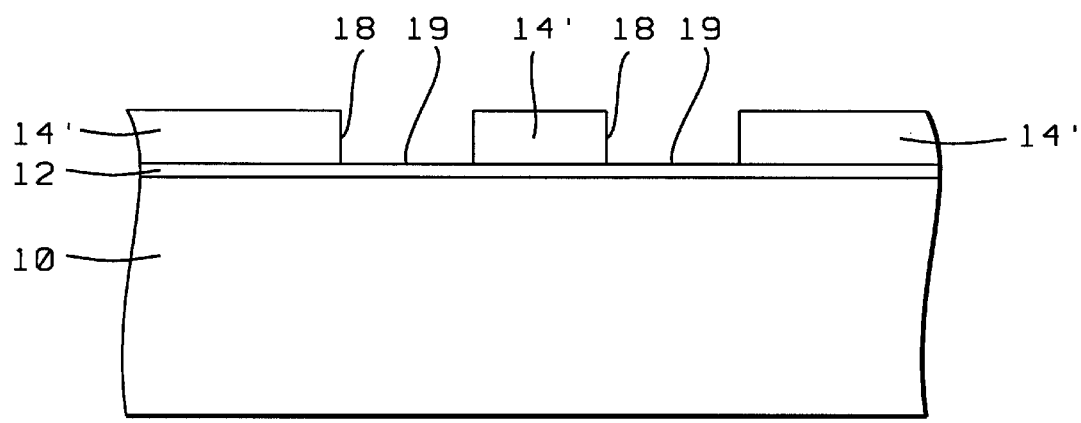

As shown in FIG. 3, patterned photoresist layer 16 is then removed, preferably by an ashing process that may be conducted in the same reaction chamber in which patterned hard mask layer 14' was formed and in which the following trench etching steps are performed.

First Trench Etching Process to Form Upper Rounded Corners 24 of Trench 26

Figure 4:
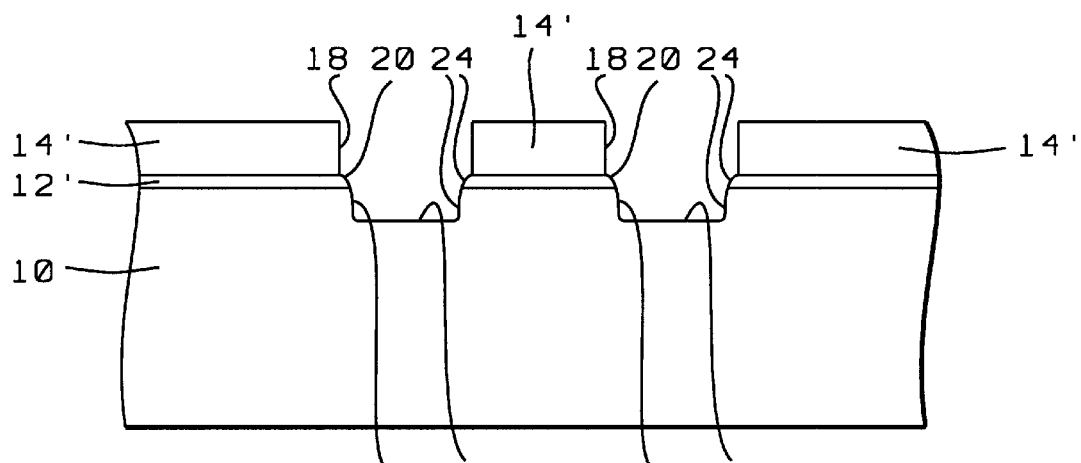

As shown in FIG. 4, a first trench etching process is used to etch through the exposed one or more portions 19 of oxide layer 20 and partially into substrate 10 to form patterned oxide layer 12' and first shallow trench 22 within substrate 10 having upper rounded corners 24 at the interface between substrate 10 and patterned oxide layer 12'. First shallow trench is preferably from about 200 to 600 Å deep and is more preferably from about 400 to 500 Å deep.

Completed tapered trench 26 includes upper rounded corners 24 (see below).

The first trench etching process is an isotropic plasma etch process using HBr and preferably a carbon-containing gas and more preferably a fluorohydrocarbon gas such as, for example, $CF_4$, $C_2F_6$, $CHF_3$, $CH_2F_2$, $C_5F_8$ or $C_4F_8$. The first trench etching process is performed at the following conditions:

HBr flow: from about 10 to 40 sccm;

C-containing gas flow: from about 40 to 160 sccm;

HBr:C-containing gas ratio: from about 1:3 to 1:5;

temperature: from about 20 to 80° C.;

pressure: from about 20 to 60 mTorr; and

RF power: from about 500 to 1000 W.

Second Trench Etching Process to Complete Trench 26

Figure 5:
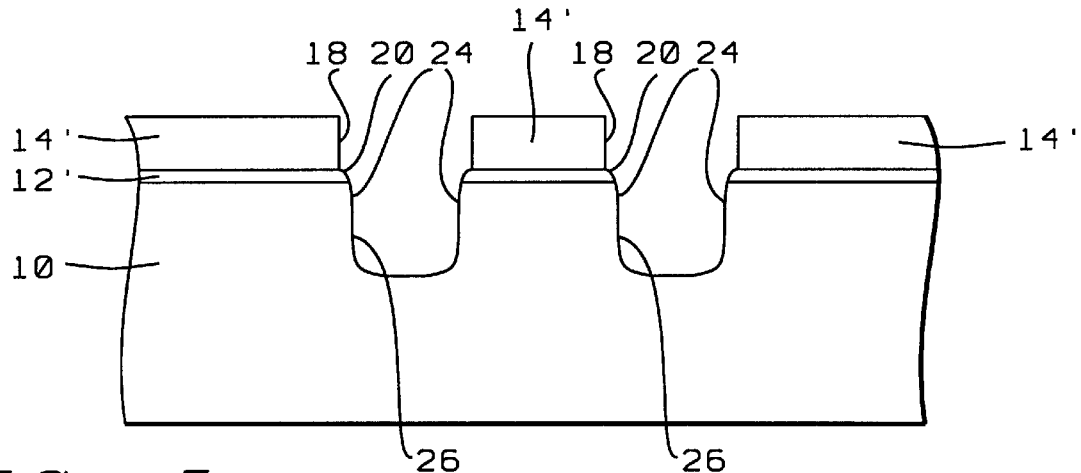

As shown in FIG. 5, a second trench etching process is used to complete formation of tapered trench 26 having upper rounded corners 24 within substrate 10.

The second trench etching process uses $O_2$ and a silicon (Si) etching gas such as $Cl_2$ or HBr. The second trench etching process is performed at the following conditions:

$O_2$ flow: from about 8 to 18 sccm;

Si-etching gas flow: from about 80 to 180 sccm;

$O_2$:Si-etching gas ratio: from about 1:15 to 1:5;

temperature: from about 20 to 80° C.;

pressure: from about 30 to 70 mTorr;

RF power: from about 200 to 500 W; and bias power: from about 100 to 300 W.

The $O_2$:Si-etching gas ratio and pressure may be adjusted as necessary during tapered trench 26 formation to obtain the desired tapered trench angle and to maintain upper rounded corners 24.

The second trench etching process may comprise multiple steps. For example a first sub-step may be conducted at a low pressure of about 30 mTorr with a low $O_2$:$Cl_2$ ratio of about 1:15 so that a greater amount of polymer is deposited to protect upper rounded corners 24 and the taper profile of tapered trench 26. Then, a second sub-step may be conducted at a higher pressure of about 60 mTorr and a higher $O_2$:$Cl_2$ ratio of about 1:7 that deposits a less amount of polymer and provides for a more vertical profile in forming the balance of tapered trench 26.

As noted above, the entire method of the present invention may be performed in a common reactor chamber.

Specific Example

The inventors formed a tapered trench 26 using the following first and second trench etching processes:

Select first trench etching process parameters:
HBr:$CHF_3$ gas ratio: about 1:5;
pressure: from about 20 to 40 mTorr;
RF power: from about 600 to 1000 W; and
bias power: from about 50 to 70 W.

Select second trench etching process parameters:
$O_2$:$Cl_2$ gas ratio: from about 1:15 to 1:7;
pressure: from about 20 to 70 mTorr;
RF power: from about 300 to 500 W; and
bias power: from about 200 to 300 W.

Advantages of the Present Invention

The advantages of the present invention include:

1. proximity-free due to the photoresist-free process;

2. loading effect-free due to the photoresist-free process;

3. adjustable trench angle; and 4. defect-free due to the $Cl_2$/$O_2$ chemistry.

While particular embodiments of the present invention have been illustrated and described, it is not intended to limit the invention, except as defined by the following claims.

We claim:

1. A method for forming a trench having upper rounded corners, comprising the steps of:

providing a substrate having an oxide layer formed thereover;

forming a hard mask layer over the oxide layer;

forming a patterned patterning layer over the hard mask layer leaving one or more portions of the hard mask layer exposed;

patterning the hard mask layer using the patterned patterning layer as a mask to form a patterned hard mask layer having one or more openings exposing one or more portions of the oxide layer;

removing the patterned patterning layer;

patterning the oxide layer using the patterned hard mask layer as a mask using a first trench etching process to etch through the oxide layer at the one or more exposed portions of the oxide layer and into the substrate to form one or more shallow trenches within the substrate having upper rounded corners at the respective interfaces between substrate and patterned oxide layer; and further etching the substrate at the one or more shallow trenches using a second trench etching process to form one or more completed trenches having the upper rounded corners at the respective interfaces between substrate and patterned oxide layer.

2. The method of claim 1, wherein the oxide layer is from about 80 to 250 Å thick and the hard mask layer is from about 800 to 2000 Å.

3. The method of claim 1, wherein the oxide layer is from about 150 to 200 Å thick and the hard mask layer is from about 1000 to 1500 Å.

4. The method of claim 1, wherein the one or more completed trenches are tapered.

5. The method of claim 1, wherein the one or more shallow trenches each have a depth of from about 200 to 600 Å.

6. The method of claim 1, wherein the one or more shallow trenches each have a depth of from about 400 to 500 Å.

7. The method of claim 1, wherein the first trench etching process is an isotropic plasma etch process using HBr and a carbon-containing gas; and the second trench etching process uses $O_2$ and a silicon etching gas.

8. The method of claim 1, wherein the first trench etching process is an isotropic plasma etch process using HBr and a fluorohydrocarbon gas selected from the group consisting of $CF_4$, $C_2F_6$, $CHF_3$, $CH_2F_2$, $C_4F_8$ and $C_5F_8$; and the second trench etching process uses $O_2$ and a silicon etching gas selected from the group consisting of $Cl_2$ and HBr.

9. The method of claim 1, wherein the first trench etching process includes the following conditions:

HBr flow: from about 10 to 40 sccm;

C-containing gas flow: from about 40 to 160 sccm;

HBr:C-containing gas ratio: from about 1:3 to 1:5;

temperature: from about 20 to 80° C.;

pressure: from about 20 to 60 mTorr;

RF power: from about 500 to 100 W; and bias power: from about 0 to 100 W; and the second trench etching process includes the following conditions:

$O_2$ flow: from about 8 to 18 sccm;

Si-etching gas flow: from about 80 to 180 sccm;

$O_2$:Si-etching gas ratio: from about 1:15 to 1:5;

temperature: from about 20 to 80° C.;

pressure: from about 30 to 70 mTorr;

RF power: from about 200 to 500 W; and bias power: from about 100 to 300 W.

10. The method of claim 1, wherein the second trench etching process comprises two or more sub-steps.

11. The method of claim 1, wherein the second trench etching process comprises: a first sub-step at a pressure of about 30 mTorr and using $O_2$ and $Cl_2$ at an $O_2$:$Cl_2$ ratio of about 1:15; and a second sub-step at a pressure of about 60 mTorr and an $O_2$:$Cl_2$ ratio of about 1:7.

12. The method of claim 1, wherein the first trench etching process includes the following conditions:

HBr:$CHF_3$ gas ratio: about 1:5;

pressure: from about 20 to 40 mTorr;

RF power: from about 600 to 1000 W; and bias power: from about 50 to 70 W; and the second trench etching process includes the following conditions:

$O_2$:$Cl_2$ gas ratio: from about 1:15 to 1:7;

pressure: from about 20 to 70 mTorr;

RF power: from about 300 to 500 W; and bias power: from about 200 to 300 W.

13. The method of claim 1, wherein the hard mask layer is comprised of a material selected from the group consisting of $Si_3N_4$ and SiON.

14. The method of claim 1, wherein the hard mask layer is $Si_3N_4$.

15. A method for forming a trench having upper rounded corners, comprising the steps of:

provoding a substrate having an oxide layer formed thereover;

forming a hard mask layer over the oxide layer;

forming a patterned patterning layer over the hard mask layer leaving one or more portions of the hard mask layer exposed;

patterning the hard mask layer using the patterned patterning layer as a mask to form a patterned hard mask layer having one or more openings exposing one or more portions of the oxide layer;

removing the patterned patterning layer;

patterning the oxide layer using the patterned hard mask layer as a mask using a first trench etching process to etch through the oxide layer at the one or more exposed portions of the oxide layer and into the substrate to form one or more shallow trenches within the substrate having upper rounded corners at the respective interfaces between substrate and patterned oxide layer; wherein the first trench etching process is an isotropic plasma etch process using HBr and a carbon-containing gas; and further etching the substrate at the one or more shallow trenches using a second trench etching process to form one or more completed trenches having the upper rounded corners at the respective interfaces between substrate and patterned oxide layer; wherein the second trench etching process uses $O_2$ and a silicon etching gas.

16. The method of claim 15, wherein the oxide layer is from about 80 to 250 Å thick and the hard mask layer is from about 800 to 2000 Å.

17. The method of claim 15, wherein the oxide layer is from about 150 to 200 Å thick and the hard mask layer is from about 1000 to 1500 Å.

18. The method of claim 15, wherein the one or more completed trenches are tapered.

19. The method of claim 15, wherein the one or more shallow trenches each have a depth of from about 200 to 600 Å.

20. The method of claim 15, wherein the one or more shallow trenches each have a depth of from about 400 to 500 Å.

21. The method of claim 15, wherein the first trench etching process is an isotropic plasma etch process using HBr and a fluorohydrocarbon gas selected from the group consisting of $CF_4$, $C_2F_6$, $CHF_3$, $CH_2F_2$, $C_5F_8$ and $C_4F_8$; and the second trench etching process uses $O_2$ and a silicon etching gas selected from the group consisting of $Cl_2$ and HBr.

22. The method of claim 15, wherein the first trench etching process includes the following conditions:

HBr flow: from about 10 to 40 sccm;

C-containing gas flow: from about 40 to 160 sccm;

HBr:C-containing gas ratio: from about 1:3 to 1:5;

temperature: from about 20 to 80° C.;

pressure: from about 20 to 60 mTorr;

RF power: from about 500 to 1000 W; and bias power: from about 0 to 100 W; and the second trench etching process includes the following conditions:

$O_2$ flow: from about 8 to 18 sccm;

Si-etching gas flow: from about 80 to 180 sccm;

$O_2$:Si-etching gas ratio: from about 1:15 to 1:5;

temperature: from about 20 to 80° C.;

pressure: from about 30 to 70 mTorr;

RF power: from about 200 to 500 W; and bias power: from about 100 to 300 W.

23. The method of claim 15, wherein the second trench etching process comprises two or more sub-steps.

24. The method of claim 15, wherein the second trench etching process comprises: a first sub-step at a pressure of about 30 mTorr and using $O_2$ and $Cl_2$ at an $O_2$:$Cl_2$ ratio of about 1:15; and a second sub-step at a pressure of about 60 mTorr and an $O_2$:$Cl_2$ ratio of about 1:7.

25. The method of claim 15, wherein the first trench etching process includes the following conditions:

HBr:$CHF_3$ gas ratio: about 1:5;

pressure: from about 20 to 40 mTorr;

RF power: from about 600 to 1000 W; and bias power: from about 50 to 70 W; and the second trench etching process includes the following conditions:

$O_2$:$Cl_2$ gas ratio: from about 1:15 to 1:7;

pressure: from about 20 to 70 mTorr;

RF power: from about 300 to 500 W; and bias power: from about 200 to 300 W.

26. The method of claim 15, wherein the hard mask layer is comprised of a material selected from the group consisting of $Si_3N_4$ and SiON.

27. The method of claim 15, wherein the hard mask layer is $Si_3N_4$.

28. A method for forming a trench having upper rounded corners, comprising the steps of:

providing a substrate having an oxide layer formed thereover;

forming a hard mask layer over the oxide layer;

forming a patterned patterning layer over the hard mask layer leaving one or more portions of the hard mask layer exposed;

patterning the hard mask layer using the patterned patterning layer as a mask to form a patterned hard mask layer having one or more openings exposing one or more portions of the oxide layer;

removing the patterned patterning layer;

patterning the oxide layer using the patterned hard mask layer as a mask using a first trench etching process to etch through the oxide layer at the one or more exposed portions of the oxide layer and into the substrate to form one or more shallow trenches within the substrate having upper rounded corners at the respective interfaces between substrate and patterned oxide layer; wherein the first trench etching process includes the following conditions:

HBr flow: from about 10 to 40 sccm;

C-containing gas flow: from about 40 to 160 sccm;

HBr:C-containing gas ratio: from about 1:3 to 1:5;

temperature: from about 20 to 80° C.;

pressure: from about 20 to 60 mTorr;

RF power: from about 500 to 1000 W; and bias power: from about 0 to 100 W; and further etching the substrate at the one or more shallow trenches using a second trench etching process to form one or more completed trenches having the upper rounded corners at the respective interfaces between substrate and patterned oxide layer; wherein second trench etching process includes the following conditions:

$O_2$ flow: from about 8 to 18 sccm;
Si-etching gas flow: from about 80 to 180 sccm;
$O_2$:Si-etching gas ratio: from about 1:15 to 1:5;
temperature: from about 20 to 80° C.;
pressure: from about 30 to 70 mTorr;
RF power: from about 200 to 500 W; and
bias power: from about 100 to 300 W.

29. The method of claim 28, wherein the oxide layer is from about 80 to 250 Å thick and the hard mask layer is from about 800 to 2000 Å.

30. The method of claim 28, wherein the oxide layer is from about 150 to 200 Å thick and the hard mask layer is from about 1000 to 1500 Å (both more preferred).

31. The method of claim 28, wherein the one or more completed trenches are tapered.

32. The method of claim 28, wherein the one or more shallow trenches each have a depth of from about 200 to 600 Å.

33. The method of claim 28, wherein the one or more shallow trenches each have a depth of from about 400 to 500 Å.

34. The method of claim 28, wherein the C-containing gas of the first trench etching process is a fluorohydrocarbon gas selected from the group consisting of $CF_4$, $C_2F_6$, $CHF_3$, $CH_2F_2$, $C_5F_8$ and $C_4F_8$; and the Si-etching gas of the second trench etching process is selected from the group consisting of $Cl_2$ and HBr.

35. The method of claim 28, wherein the second trench etching process comprises two or more sub-steps.

36. The method of claim 28, wherein the second trench etching process comprises: a first sub-step at a pressure of about 30 mTorr and using $O_2$ and $Cl_2$ at an $O_2$:$Cl_2$ ratio of about 1:15; and a second sub-step at a pressure of about 60 mTorr and an $O_2$:$Cl_2$ ratio of about 1:7.

37. The method of claim 28, wherein the first trench etching process includes the following conditions:

HBr:$CHF_3$ gas ratio: about 1:5;
pressure: from about 20 to 40 mTorr;
RF power: from about 600 to 1000 W; and
bias power: from about 50 to 70 W; and the second trench etching process includes the following conditions:

$O_2$:$Cl_2$ gas ratio: from about 1:15 to 1:7;
pressure: from about 20 to 70 mTorr;
RF power: from about 300 to 500 W; and
bias power: from about 200 to 300 W.

38. The method of claim 28, wherein the hard mask layer is comprised of a material selected from the group consisting of $Si_3N_4$ and SiON.

39. The method of claim 28, wherein the hard mask layer is $Si_3N_4$.

* * * * *